United States Patent
Yoshida (10) Patent No.: US 8,026,536 B2
(45) Date of Patent: Sep. 27, 2011

(54) SEMICONDUCTOR DEVICE HAVING A DUMMY GATE

(75) Inventor: Kazuhiro Yoshida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 1370 days.

(21) Appl. No.: 11/391,286

(22) Filed: Mar. 29, 2006

(65) Prior Publication Data

US 2006/0220066 A1   Oct. 5, 2006

(30) Foreign Application Priority Data

Mar. 30, 2005   (JP) .................. 2005-099239

(51) Int. Cl.
*H01L 23/52* (2006.01)
(52) U.S. Cl. .................. 257/204; 257/208; 257/E27.06
(58) Field of Classification Search .................. 257/204, 257/206, 208, E27.06
See application file for complete search history.

(56) References Cited

U.S. PATENT DOCUMENTS

| | | | | |
|---|---|---|---|---|
| 4,851,892 A * | 7/1989 | Anderson et al. | ............. | 257/206 |
| 5,814,844 A * | 9/1998 | Nagata et al. | ............. | 257/206 |
| 6,791,128 B1 * | 9/2004 | Yamauchi | ............. | 257/206 |
| 6,816,399 B2 * | 11/2004 | Hoya et al. | ............. | 257/202 |
| 6,833,595 B1 * | 12/2004 | Iwasaki | ............. | 257/401 |
| 7,170,115 B2 * | 1/2007 | Tokunaga et al. | ............. | 257/202 |
| 7,466,186 B2 * | 12/2008 | Sumita | ............. | 327/534 |
| 2005/0280031 A1 * | 12/2005 | Yano | ............. | 257/204 |

FOREIGN PATENT DOCUMENTS

JP   2000-216263   8/2000

* cited by examiner

*Primary Examiner* — Matthew Landau
*Assistant Examiner* — Sun M Kim
(74) *Attorney, Agent, or Firm* — McGinn IP Law Group, PLLC (57) ABSTRACT

A semiconductor device includes a plurality of MOS transistors, wherein each of the MOS transistors has a drain region, a pair of source regions sandwiching therebetween the drain region, and a pair of normal gates each overlying a space between the drain region and a corresponding one of the source regions. A plurality of dummy gates are provided each between adjacent two of the MOS transistors. The dummy gate electrodes are maintained at an equi-potential with the adjacent drain regions. MOS transistors include a row of pMOS transistors and nMOS transistors, wherein each of pMOS transistors and a corresponding nMOS transistor configure a CMOS gate, and a plurality of CMOS gates configure a ring oscillator.

15 Claims, 12 Drawing Sheets

RELATED ART

FIG. 9

RELATED ART

FIG. 10

RELATED ART

FIG. 11

RELATED ART

SEMICONDUCTOR DEVICE HAVING A DUMMY GATE

BACKGROUND OF THE INVENTION

1. Field of the Invention

The present invention relates to a semiconductor device having a dummy gate and, more particularly, to a semiconductor device including a plurality of MOS transistors and a dummy gate disposed between adjacent MOS transistors.

2. Description of the Related Art

A ring oscillator in a semiconductor device is such that an odd number of inverters are connected or cascaded in a loop. If the inverter is configured by a CMOS gate configured on a semiconductor substrate, such an oscillator circuit can be formed in a small area and is suitably employed in a clock circuit of the semiconductor device. The operational speed of the oscillator circuit has been increased steadily and its oscillation frequency is about to exceed 1 GHz.

While the operational speed of the oscillator circuit has been thus improved, there has occurred a problem in that a desired operational speed cannot be obtained even with the case where a required voltage is applied to the ring oscillator. This means that the parasitic capacitance between conductive layers and between interconnects cannot be ignored in the recent semiconductor devices which have a smaller and smaller design rule. More specifically, it is generally considered that the parasitic capacitance largely contributes to the reduction in the operational speed. In order to cope with the above problem, JP-2000-216263A describes a semiconductor device formed such that the overlapping area between a diffused region and interconnects to be formed above the diffused region is reduced.

The semiconductor device described in the above publication can reduce the parasitic capacitance between the diffused region and the interconnects, to thereby prevent reduction in the operational speed. However, along with an increase in the operational speed of the recent oscillator circuit, the parasitic capacitance between the interconnects and the diffused region, in addition to the parasitic capacitance between a plurality of conductive layers and the parasitic capacitance between the interconnects within the semiconductor device, has become the critical factor that prevents the increase in the operational speed. Therefore, it is necessary to reduce the parasitic capacitance other than that between the interconnects and diffused region, in order to improve the operational speed of the semiconductor circuit.

Further, along with the increase in the operational speed of the semiconductor device, the oscillation frequency varies widely in some semiconductor devices to cause another problem. This problem is not described in the above publication.

The present inventor has conducted a study for realizing a semiconductor device designed to have an oscillation circuit, achieving a high-speed circuit operation by using the oscillation circuit, and yet capable of suppressing variation in the oscillation frequency of the oscillation circuit. As an example of the oscillator circuit, the present inventor has made a study on the ring oscillator having a circuit configuration shown in FIG. 8.

Figure 8:
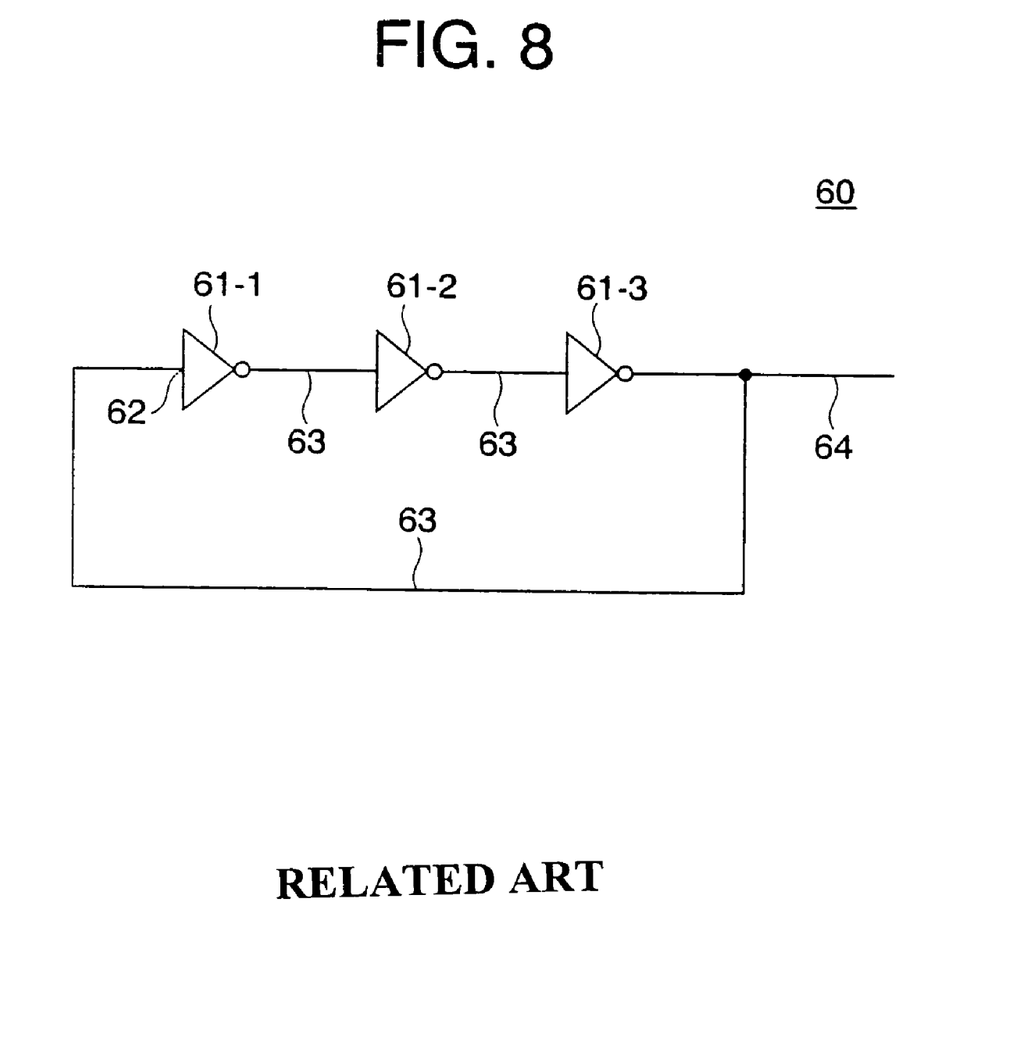
FIG. 8 is a circuit diagram showing an example of a ring oscillator.

A ring oscillator 60 is such that an odd number of inverters 61 are cascaded in a loop. The logical value of the output of each inverter is inverted after passing the each inverter within the loop, with the result that the ring oscillator oscillates at a predetermined frequency depending on the number of the inverters 61. Each of the inverters 61 is configured by a CMOS gate.

Figure 9:
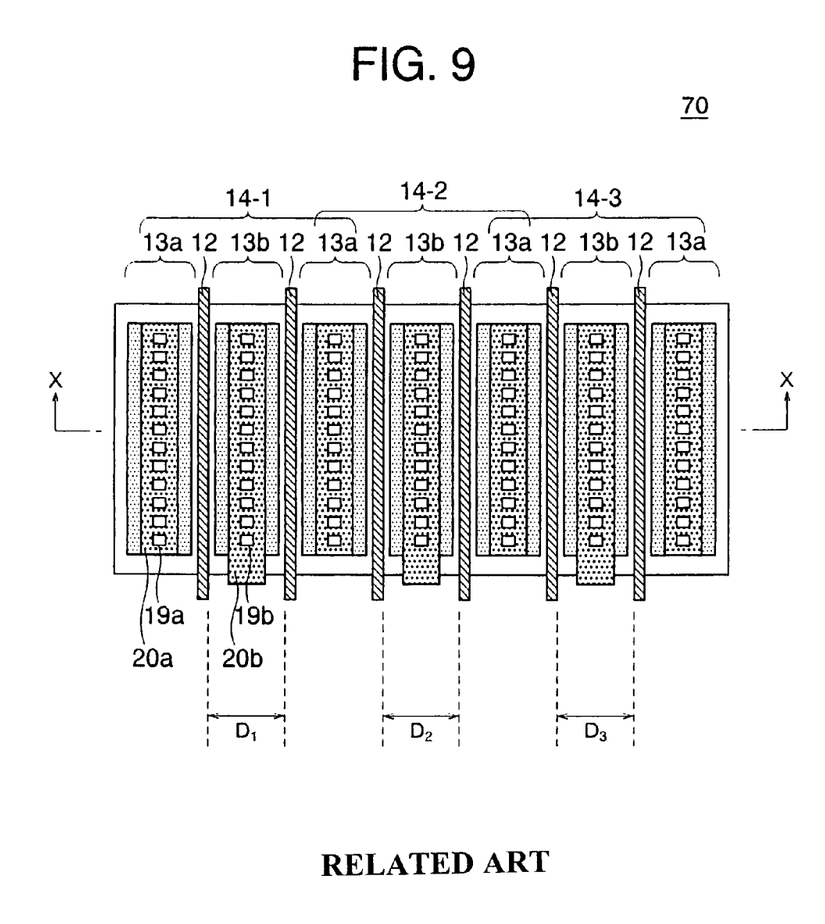
FIG. 9 is a top plan view of an example of a conventional semiconductor device.
Figure 10:
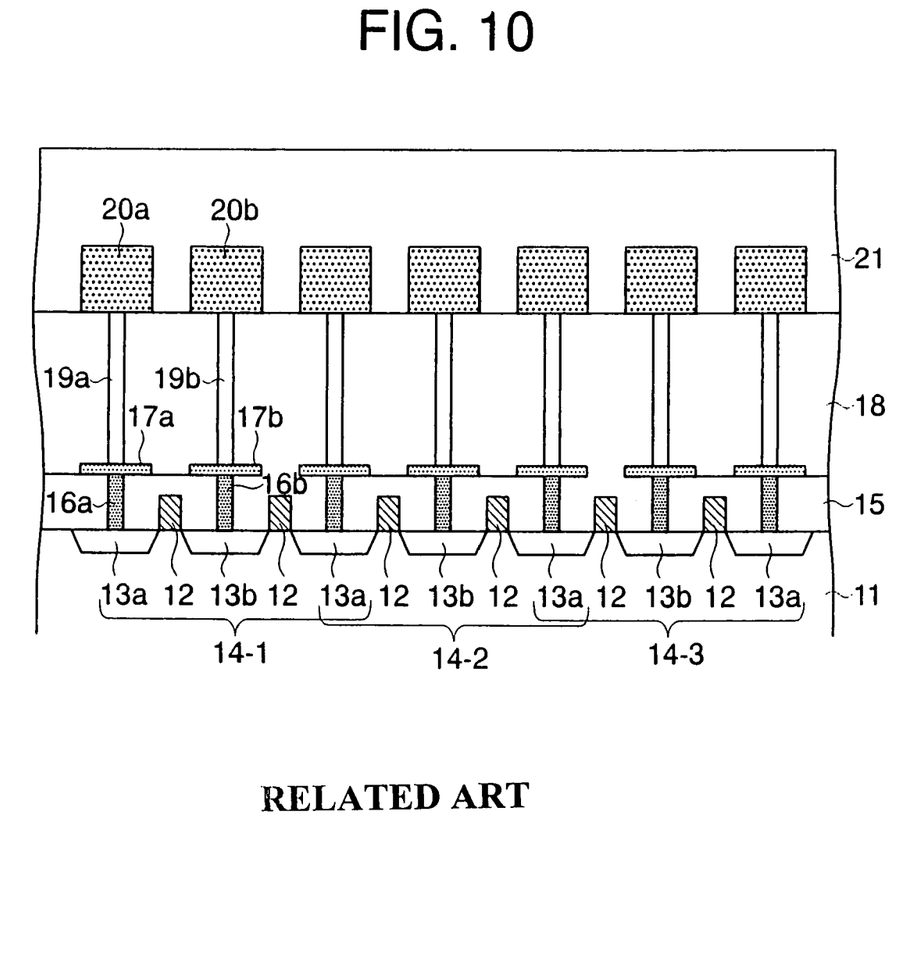
FIG. 10 is a sectional view taken along X-X line in FIG. 9.

FIG. 9 is a top plan view of a semiconductor device, showing a PMOS section in the CMOS gates of the ring oscillator 60. FIG. 10 is a sectional view taken along line X-X in FIG. 9. The semiconductor device 70 includes a semiconductor substrate 11 and gate electrodes 12 arranged at a constant pitch or constant interval on the semiconductor substrate 11. Each of the gate electrodes 12 is made of polysilicon. On both sides of the gate electrodes 12, diffused regions 13 into which p-type impurities are implanted are formed in the surface region of the semiconductor substrate 11. Each of the diffused regions 13 serves as a source 13a or drain 13b of the transistor 14. Starting from an edge of the semiconductor substrate 11, the diffused regions 13 are arranged in the order of source 13a, drain 13b, source 13a, drain 13b, . . . , drain 13b and source 13a, which is disposed in the vicinity of the other edge of the semiconductor substrate.

All the source regions 13a are connected via interconnects (not shown) to the common power source line. A pair of gate electrodes 12 on both sides of each drain region 13b is connected via an interconnect (not shown) to the drain region 13b of the precedent stage of the ring oscillator. A single transistor 14 is configured by a drain region 13b, a pair of source regions 13a on both sides of the drain region 13b, and a pair of gate electrodes 12 formed on the semiconductor substrate 11 at the portion between the source regions 13a and drain region 13b. The depicted portion of the semiconductor device 70 includes three transistors 14-1, 14-2, and 14-3. These transistors 14-1 to 14-3 correspond to the PMOS transistors in the CMOS gates configuring the inverters 61-1 to 61-3 shown in FIG. 8.

A first interlevel dielectric film 15 is formed on the semiconductor substrate 11 to cover the gate electrode 12. A first-layer source contact 16a and a first-layer drain contact 16b are formed to penetrate the first interlevel dielectric film 15. The first-layer source contact 16a reaches the source 13a, whereas the first-layer drain contact 16b reaches the drain region 13b. On the first interlevel dielectric film 15, there are formed a first-layer source line 17a and a first-layer drain line 17b. The first-layer source line 17a is connected to the first-layer source contact 16a, whereas the first-layer drain line 17b is connected to the first-layer drain contact 16b.

A second interlevel dielectric film 18 is formed on the first interlevel dielectric film 15 to cover the first-layer source line 17a and first-layer drain line 17b. A second-layer source contact 19a and a second-layer drain contact 19b are formed to penetrate the second interlevel dielectric film 18. The second-layer source contact 19a reaches the first-layer source line 17a, whereas the second-layer drain contact 19b reaches the first-layer drain line 17b.

On the second interlevel dielectric film 18, there are formed a second-layer source line 20a and a second-layer drain line 20b. The second-layer source line 20a is connected to the second-layer source contact 19a, whereas the second-layer drain line 20b is connected to the second-layer drain contact 19b. A third interlevel dielectric film 21 is formed on the second interlevel dielectric film 18 to cover the second-layer source line 20a and second-layer drain line 20b.

Each of the interconnects 17a, 17b, 20a, and 20b is made of, e.g., aluminum, and each of the contacts 16a, 16b, 20a, and 20b is made of e.g., polysilicon. The gate electrode 12 and second-layer drain line 20b extend toward the front side of FIG. 10, whereas the second-layer source line 20a extends toward the rear side of FIG. 10.

Figure 11:
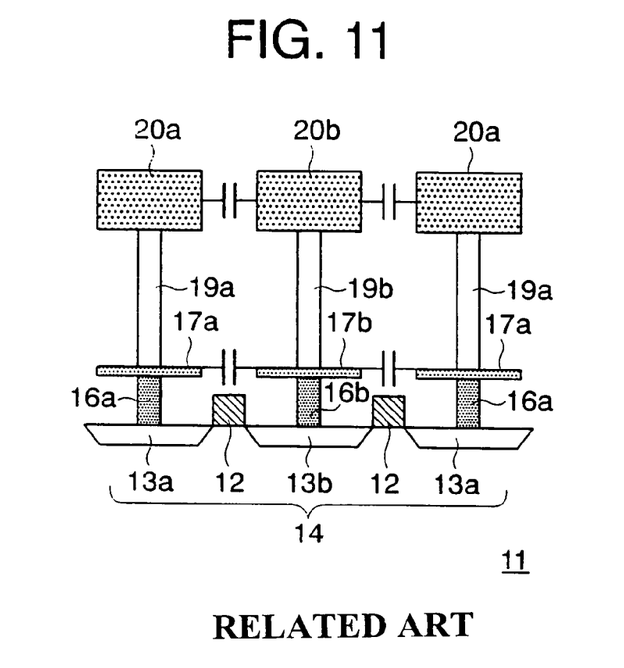
FIG. 11 is a sectional view of one transistor of FIG. 10 in an enlarged manner.

As a first investigation, the present inventor has studied the parasitic capacitance between conductive layers and between interconnects that prevent an increase in the operational speed of the semiconductor device 70. FIG. 11 shows one of the transistors 14 shown in FIG. 10 in an enlarged view. In FIG.

11, the interlevel dielectric films 15, 18, and 21 are omitted for depiction, for the sake of simplification. The first-layer source line 17a and first-layer drain line 17b are disposed close to each other, and second-layer source line 20a and second-layer drain line 20b are disposed close to each other, thereby incurring a large parasitic capacitance therebetween. The width of each interconnect is, e.g., 0.30 μm.

In addition, a large parasitic capacitance is incurred between the drain region 13b and gate electrodes 12 on both sides of the drain region 13b, between the drain region 13b and the first-layer drain line 17b, or between the drain region 13b and the second-layer drain line 20b. The parasitic capacitance between the drain region 13b and the second-layer drain line 20b has not been acknowledged heretofore as a significant problem. However, along with the reduction in the design rule and the increase in the operational speed of the semiconductor devices, the parasitic capacitance between the drain region 13b and the second-layer drain line 20b causes a substantive problem. Therefore, it is desired to reduce the above parasitic capacitance in order to improve the operational speed of the semiconductor device.

As a second investigation, the present inventor focused attention on the fact that although a reduction in the width (L) of the gate electrode is generally preferable for a reduction in the parasitic capacitance, an increase in the ratio of the interval of adjacent gate electrodes to the width (L) of the gate electrode, which ratio is referred to as an aspect ratio hereinafter, reduces the controllability for the oscillation frequency. As a first example of the semiconductor device, the present inventor manufactured the semiconductor device 70 of FIG. 9 in which a variety of aspect ratios are selected, with the width L of the gate electrode being as a constant. The width L may be referred to as "L-value" hereinafter, and the L-value in the actual semiconductor device may be referred to as "product L-value".

Further, as a second example of the semiconductor device, the present inventor manufactured the semiconductor device 70 of FIG. 9 in which the transistors 14-1 to 14-3 are designed as NMOS transistors. Similarly, a variety of aspect ratios were selected in this semiconductor device, with the L-value in the product being as a constant. The relationship between the L-value and the aspect ratio was examined in the thus manufactured semiconductor devices.

Figure 12:
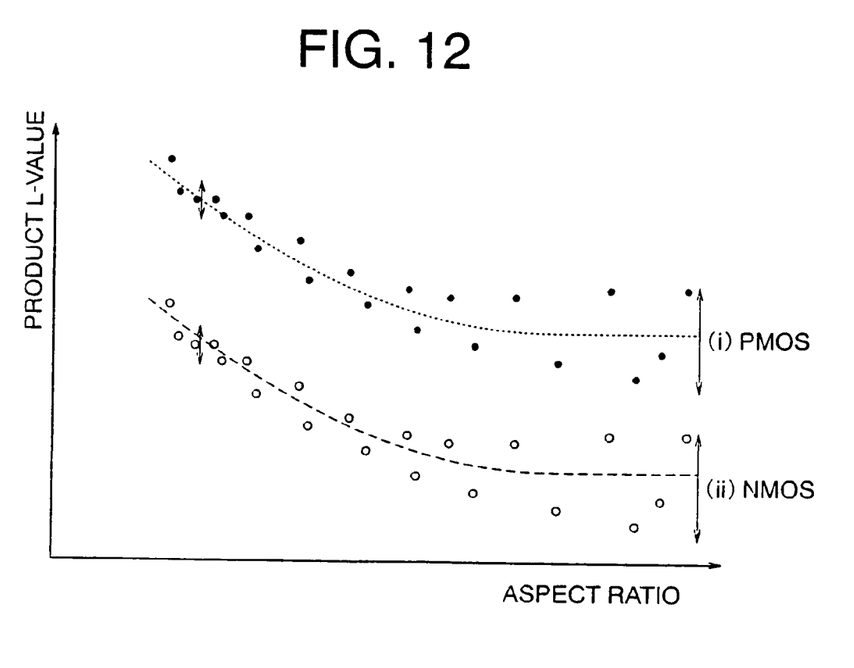
FIG. 12 is a graph showing a relationship between product L-value and aspect ratio.

FIG. 12 shows the result of the investigation where the aspect ratio is plotted on abscissa, and the product L-value is plotted on ordinate. The depicted curved (i) represents the average of the results in the first example of the semiconductor device and the depicted curved (ii) represents the average of the results in the second example of the semiconductor device. The origin for the curve (i) is shifted upward in the vertical direction for a better understanding. It is to be noted that a positive-type resist was used for exposure during forming the mask pattern of the gate electrode.

As represented by arrows in FIG. 12, increase of the aspect ratio reduces the L-value and, at the same time, increases the range of variation in the product L-value. A larger range of variation in the product L-value causes a larger disturbance in the oscillating waveform output from the oscillator circuit, resulting in a larger range of variation in the oscillation frequency. Therefore, it is desired to reduce the aspect ratio in order to increase the controllability for the circuit operation of the semiconductor device. The experiment made by the present inventor revealed that it is preferable to reduce the aspect ratio down to less than 4.1 in the semiconductor device having an oscillation frequency higher than 1 GHz.

The cause that the variation in the product L-value increases with the increase in the aspect ratio may be concluded as follows. That is, when resist is being exposed to form a mask pattern of the gate electrodes, a higher aspect ratio of the gate electrodes allows the light reflected by the surrounding area to enter the non-exposure area of the semiconductor wafer. This causes a change in the width of the mask pattern, resulting in a larger range of variation in the product L-value.

As a third investigation, the present inventor focused attention on the fact that the variation in the aspect ratio in the semiconductor device affects the oscillation frequency. A third example of the semiconductor device was manufactured, wherein the semiconductor device was designed as a ring oscillator such as shown in FIG. 8, and included PMOS transistors shown in FIG. 9 and NMOS transistors in the CMOS gates, the NMOS transistors having a configuration similar to that of the transistors 14-1, 14-2, and 14-3 shown in FIG. 9. The intervals $D_1$ to $D_3$ between adjacent gate electrodes 12 were selected at 0.8 μm. The L-value of each of the gate electrodes 12 was designed at a constant in the PMOS transistors and NMOS transistors.

Further, a fourth example of the semiconductor device was manufactured similarly to the third example except that the intervals $D_1$ to $D_3$ between the gate electrodes 12 are designed at 0.7 μm, 0.8 μμm, and 0.9μμ.

Figure 13:
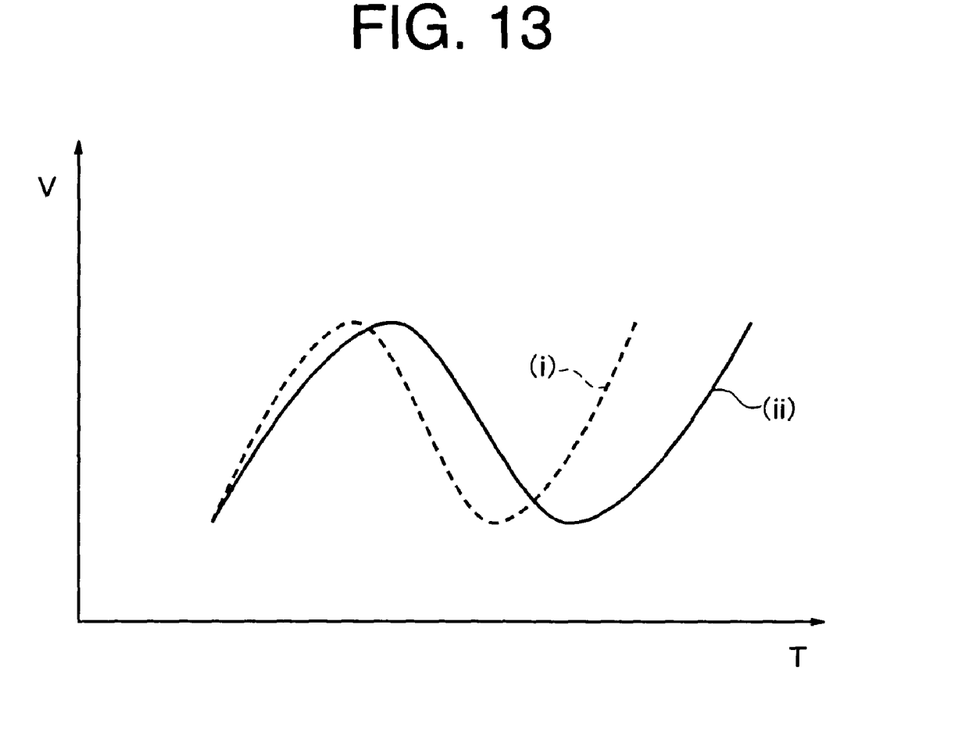
FIG. 13 is a graph showing the waveforms of oscillating signals.

The third and fourth examples of the semiconductor devices were operated and the oscillation period was examined in each device. Curved lines (i) and (ii) of FIG. 13 represent the waveforms of the oscillating signals in the third and fourth examples, respectively, of the semiconductor device. In FIG. 13, the oscillation period of the third example of the semiconductor device is about equal to a design value; whereas the oscillation period of the fourth example of the semiconductor device is longer than the design value.

Examination was made to determine the cause of difference between the oscillating period of the ring oscillators in the third and fourth examples of the semiconductor device thus manufactured and the design oscillation period. In the third example of the semiconductor device, the aspect ratio was constant, whereby the product L-value was approximately equal to the designed L-value; whereas in the fourth example of the semiconductor device, the aspect was not constant, whereby the product L-value varied widely. As a result, in the fourth example of the semiconductor device, the controllability for the circuit operation was reduced to cause the oscillation period to be longer than the design period. Therefore, it is confirmed that the L-value and aspect ratio should be designed to have a constant value in the semiconductor device, in order to increase the controllability for the circuit operation.

In order to increase the intervals between the conductive layers and between the interconnects in the conventional semiconductor device shown in FIG. 9, it my be considered that the source regions 13a shared between adjacent two of the transistors 14-1, 14-2, and 14-3 be separated to thereby isolate the transistors 14-1, 14-2, and 14-3 as individual transistors. In this configuration, however, flexibility in the arrangement of the gate electrodes is small so that it is difficult to make the interval or pitch between the gate electrodes constant. In addition, the above separation increases the surface area of the transistors 14-1, 14-2, and 14-3.

SUMMARY OF THE INVENTION

In view of the above, it is an object of the present invention to provide a semiconductor device which includes MOS transistors suitably configured to form an oscillation circuit, and which achieves a high-speed circuit operation and a superior controllability.

The present invention provides a semiconductor device including: a semiconductor substrate; a plurality of MOS transistors arranged on the semiconductor substrate in a row and each including a drain region, a pair of source regions and a pair of normal gate electrodes, which are arranged in a direction of the row, the pair of source regions sandwiching therebetween the drain region, each of the pair of normal gate electrodes overlying a space between the drain region and a corresponding one of the source regions; and a plurality dummy gate electrodes each overlying a space between one of the source regions of one of the MOS transistors and one of the source regions of an adjacent one of the MOS transistors, each of the dummy gate electrodes being maintained at an equi-potential with the one of the source regions of the one or the adjacent one of the MOS transistors.

In accordance with the semiconductor device of the present invention, the dummy gate electrode overlying the space between the source of a MOS transistor and the source of the adjacent MOS transistor increases the flexibility in the arrangement of gate electrodes of an electrode group including the normal gate electrodes and dummy gate electrodes. The increase of the flexibility in the arrangement allows the gate electrodes to be arranged with a higher regularity, thereby suppressing the range of variation in the gate width of the gate electrodes, which increases the controllability for the circuit operation, especially in the case where the MOS transistors form a ring oscillator.

DETAILED DESCRIPTION OF THE PREFERRED EMBODIMENTS

In a preferred embodiment of the present invention, the semiconductor device includes a dummy source region and another dummy gate electrode in the vicinity of the outermost MOS transistor in the row, wherein the existence of the another dummy gate electrode allows the range of variation in the width of the gate electrode of the outermost MOS transistor to be suppressed.

In a preferred embodiment of the present invention, the adjacent two of the source regions sandwiching therebetween the dummy gate electrode are connected in common to the source line having a width smaller than the total width of the adjacent two of the source regions and overlying the dummy gate electrode. This increases the interval between the source line and the drain line connected to the drain region, thereby reducing the parasitic capacitance therebetween. Further, by reducing the width of the drain region while suppressing the parasitic capacitance between the source line and the drain line, it is possible to reduce the surface area of the drain region. This reduces the parasitic capacitance between the drain region and the gate electrodes on both sides of the drain region or the parasitic capacitance between the drain region and the drain line overlying the drain region.

Further, by reducing the width of the source and drain regions while suppressing the parasitic capacitance therebetween, it is possible to prevent an increase in the size of the semiconductor device, which is caused by the increase in the number of source regions. It is also preferable that the dummy source region and the source region adjacent to each other be connected in common to the source line having a width smaller than the total width of these diffused regions and overlying the dummy gate electrode.

In a preferred embodiment of the present invention, the drain line to be formed as a common layer with the source line and having a width almost equal to the drain region may be provided above the drain region. This configuration allows the manufacturing process of the semiconductor device to form the drain line with ease. In an alternative, the drain line to be formed as the common layer with the source line and having a width smaller than the drain regions may overlie the drain region. This reduces the parasitic capacitance between the drain line and the source line and the parasitic capacitance between the drain line and the drain region.

In a preferred embodiment of the present invention, the gate electrodes of an electrode group including the normal gate electrodes and the dummy gate electrodes have the same width and are arranged at even intervals. With this configuration, it is possible to suppress the range of variation in the width of the gate electrodes and to increase the controllability for the circuit operation. More preferably, the ratio of the interval between adjacent electrodes in the electrode group including the normal gate electrodes and the dummy gate electrodes to the width thereof is less than 4.1. In this configuration, it is possible to sufficiently suppress the range of variation in the gate width and to sufficiently suppress the range of variation in the oscillation frequency. This configuration may be preferably employed in the semiconductor device having an oscillation frequency higher than 1 GHz.

In the present invention, the MOS transistors are arranged in a plurality of rows including at least first and second row disposed adjacent to each other, the MOS transistors in the first row configure pMOS transistors, the MOS transistors in the second row configure nMOS transistors, and each of the pMOS transistors and a corresponding one of the nMOS transistors configure a CMOS gate.

Preferably, the drain region of the PMOS transistor and the drain region of the corresponding NMOS transistor are connected to each other via a drain line extending normal to the direction of the row, and the end of the drain line is retracted from the edge of the drain region. With this configuration, it is possible to reduce the parasitic capacitance between the drain line and the source line or the parasitic capacitance between the drain line and the drain region. In the present invention, an odd number of CMOS gates arranged in a row may be connected to each other as a ring oscillator.

Figure 1:
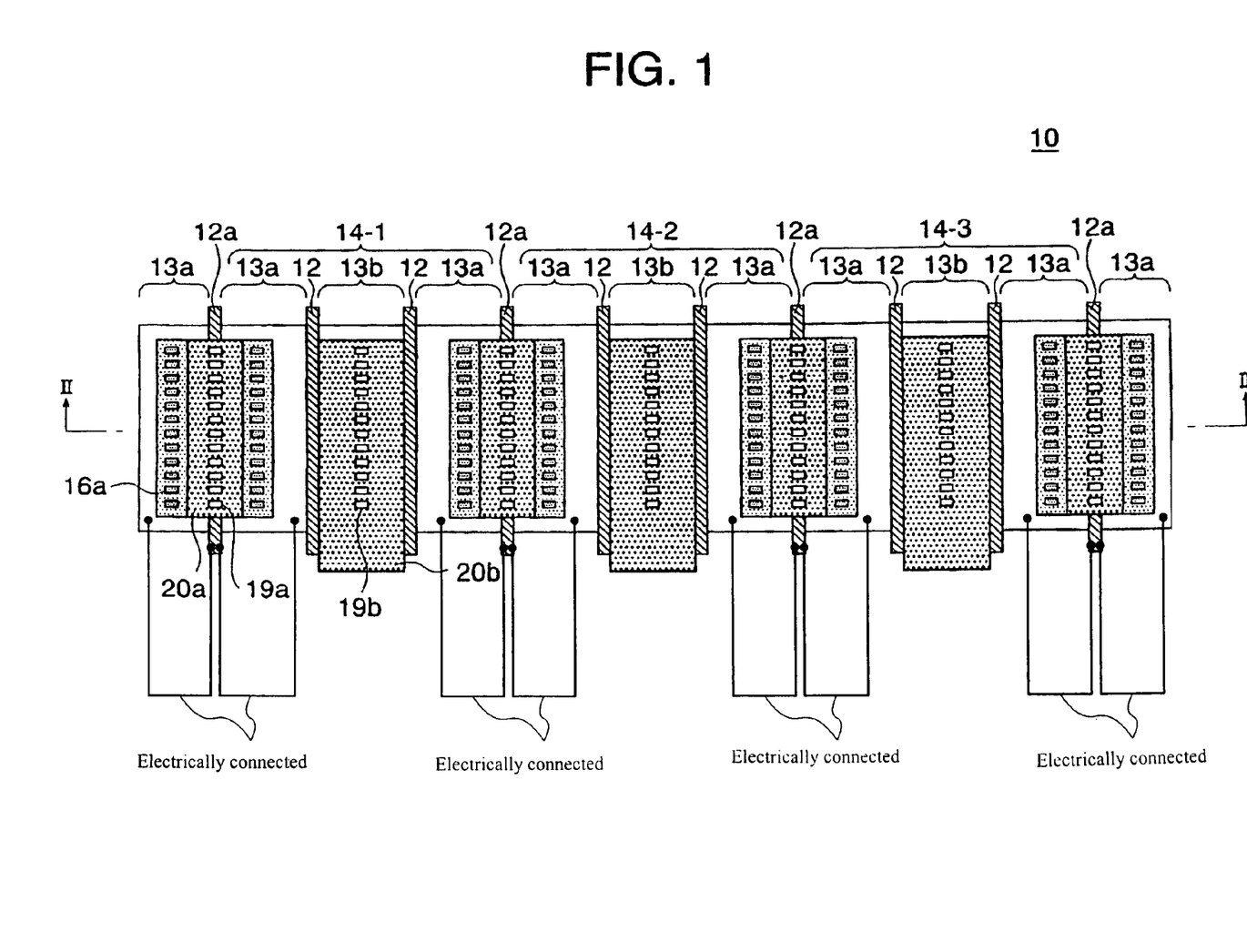
FIG. 1 is a top plan view of a semiconductor device according to a first embodiment of the present invention.
Figure 2:
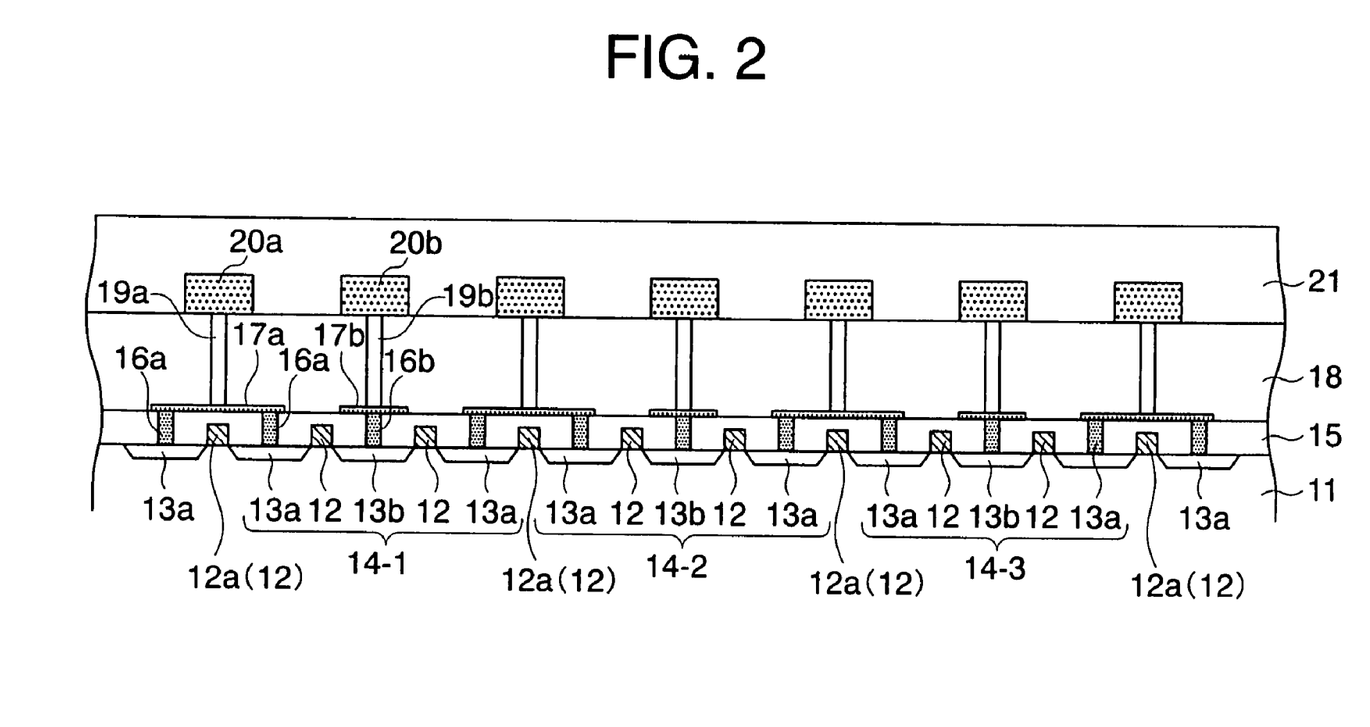
FIG. 2 is a sectional view taken along II-II line in FIG. 1.

The present invention will be now described below in further detail with reference to the accompanying drawings. FIG. 1 is a top plan view of a semiconductor device according to a first embodiment of the present invention. FIG. 2 is a sectional view taken along line II-II in FIG. 1. In FIG. 2, reference numerals used in the conventional semiconductor device 70 shown in FIGS. 9 and 10 denote the components which are common to the conventional one. Similarly to the semiconductor device 70 shown in FIG. 9, the semiconductor device, generally designated by numeral 10, includes PMOS transistors in the CMOS gates of the ring oscillator 60 such as shown in FIG. 8.

In the semiconductor device 10, the diffused regions 13 are arranged, starting from a first edge of the semiconductor device 10, in the order of source (source region) 13a, source 13a, drain (drain region) 13b, source 13a, source 13a, drain 13b, . . . , drain 13b, source 13a and source 13a, which is disposed at a second edge of the semiconductor device opposing the first edge.

The gate electrodes include normal gate electrodes 12 of respective pMOS transistors 14 (14-1, 14-2, 14-3) and dummy gate electrodes 12a disposed between adjacent two of the pMOS transistors, i.e., between the source of pMOS transistors and the source of adjacent pMOS transistors, as well as above the source of the outermost pMOS transistors. The dummy gate electrodes 12a are maintained at the same potential as the potential of the source regions 13a as by using interconnects not shown.

A single pMOS transistor 14 is configured by a single drain region 13b, a pair of source regions 13a on both sides of the drain region 13b, and a pair of (normal) gate electrodes 12 formed on the semiconductor substrate 11 at the portion between the source 13a and drain region 13b. The depicted portion of the semiconductor device 10 includes therein three transistors 14-1, 14-2, and 14-3. The source regions 13a formed in the vicinity of both the edges of the semiconductor substrate 11 outside the corresponding dummy gate electrode 12a are dummy sources. A first-layer source line 17a is connected via the first-layer source contacts 16a disposed adjacent to each other to the source regions 13a of the adjacent pMOS transistors 14-1 and 14-2, for example.

In the first embodiment, the L-value of all the gate electrodes including the normal gate electrodes 12 and the dummy gate electrodes 12a are designed at 0.23 μm, and the interval between adjacent two of the gate electrodes including the normal electrodes 12 and dummy gate electrodes 12a are designed at 0.57 μμm. The aspect ratio is about 2.5 in this configuration.

Figure 3:
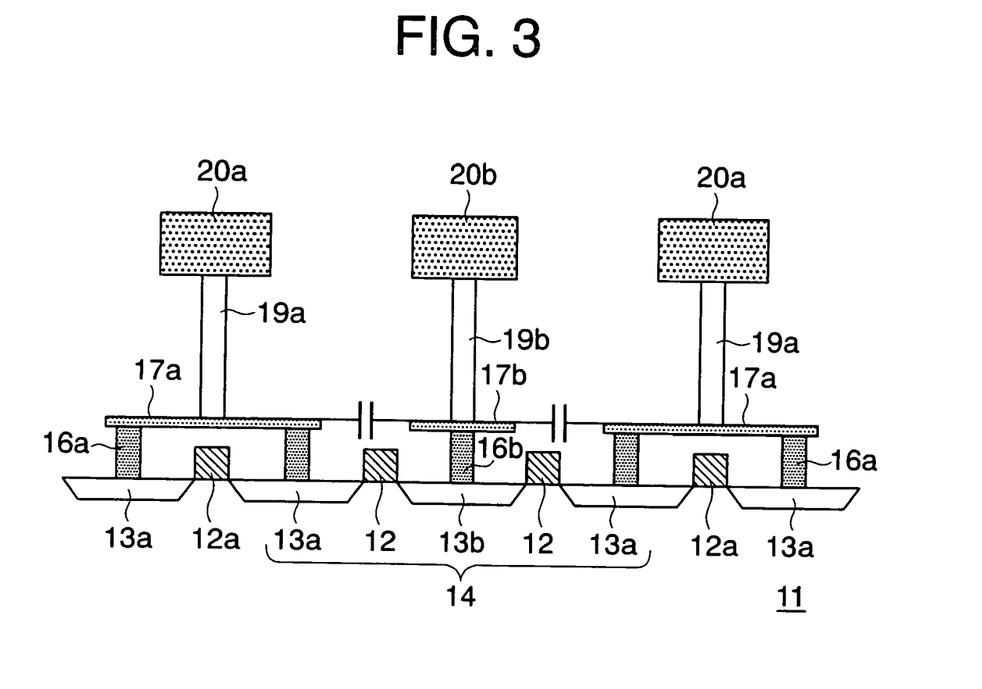
FIG. 3 is a sectional view showing one transistor of FIG. 2 and its vicinity in an enlarged manner.

FIG. 3 shows one of the pMOS transistors 14 shown in FIG. 2 and the vicinity thereof in an enlarged view. In FIG. 3, interlevel dielectric films 15, 18, and 21 are omitted for depiction, for the sake of simplification. In the semiconductor device according to the present embodiment, the diffused regions 13 are arranged, starting from the first edge of the semiconductor substrate 11, in the order of source 13a, source 13a, drain 13b, source 13a, source 13a, drain 13b, . . . , drain 13b, source 13a, and source 13a, which is disposed in the vicinity of the second edge opposing the first edge. In this configuration, the width required for the first-layer source line 17a by the design rule can be secured between the adjacent two of the first-layer source contacts 16a.

Therefore, it is possible to reduce the length by which the edge of the first-layer source line 17 at protrudes from the first-layer source contact 16a toward the first-layer drain line 17b, as compared to the length of the conventional semiconductor device 70. This allows the interval between the first-layer source line 17a and the first-layer drain line 17b to be increased, resulting in a reduction of the parasitic capacitance between the first-layer interconnects 17a and 17b. In addition, the distance between the second-layer drain line 20b and the second-layer source line 20a is increased to be equal to or more than that between the first-layer drain line 17b and the first-layer source line 17a. As a result, it is also possible to reduce the parasitic capacitance between the second-layer interconnects 20a and 20b.

Further, it is possible to reduce the width of the drain region 13b while reducing the parasitic capacitance between the first-layer interconnects 17a and 17b or that between the second-layer interconnects 20a and 20b. This reduces the surface area of the drain region 13b, thereby making it possible to reduce the parasitic capacitance between the drain region 13b and the gate electrodes 12 on both sides of the drain region 13b or the parasitic capacitance between the drain region 13b and the first-layer drain line 17b disposed above the drain region 13b or the second-layer drain line 20b. The above reduction of the parasitic capacitance allows the operational speed in the semiconductor device to be increased. Further, by reducing the width of the diffused region 13 while reducing the parasitic capacitance, it is possible to prevent an increase in the size of the semiconductor device 10, which may be caused by the increase in the number of source regions 13a.

Further, in the semiconductor device of the present embodiment, the aspect ratio is less than 4.1, and the L-value and aspect ratio are designed to have identical values, thereby reducing the range of variation in the product L-value. This can increase the controllability for the circuit operation. It is to be noted that although the dummy gate electrodes 12a in the vicinity of both edges of the semiconductor substrate 11 are not configured as a part of the transistors, such as 14-1, existence of the dummy gate electrodes 12a can reduce the range of variation in the product L-value of the gate electrodes 12 disposed adjacent to the dummy gate electrodes 12a.

The interval between the gate electrodes may appropriately be designed within a range in which the aspect ratio falls to less than 4.1. Although an increase in the interval between the gate electrodes increases the interval between the first-layer interconnects 17a and 17b and the interval between the second-layer interconnects 20a and 20b to thereby reduce the parasitic capacitance between the interconnects, the size of the semiconductor device 10 may be increased. Therefore, it is desirable to design the distance between the gate electrodes in consideration of a balance between the parasitic capacitance and the size of the semiconductor device 10. A similar advantage can be obtained even when the source regions 13a and first-layer source contacts 16a in the vicinity of both the edges of the semiconductor substrate 11 are not formed, so long as other portions are formed to have a configuration similar to that as described above.

Figure 4:
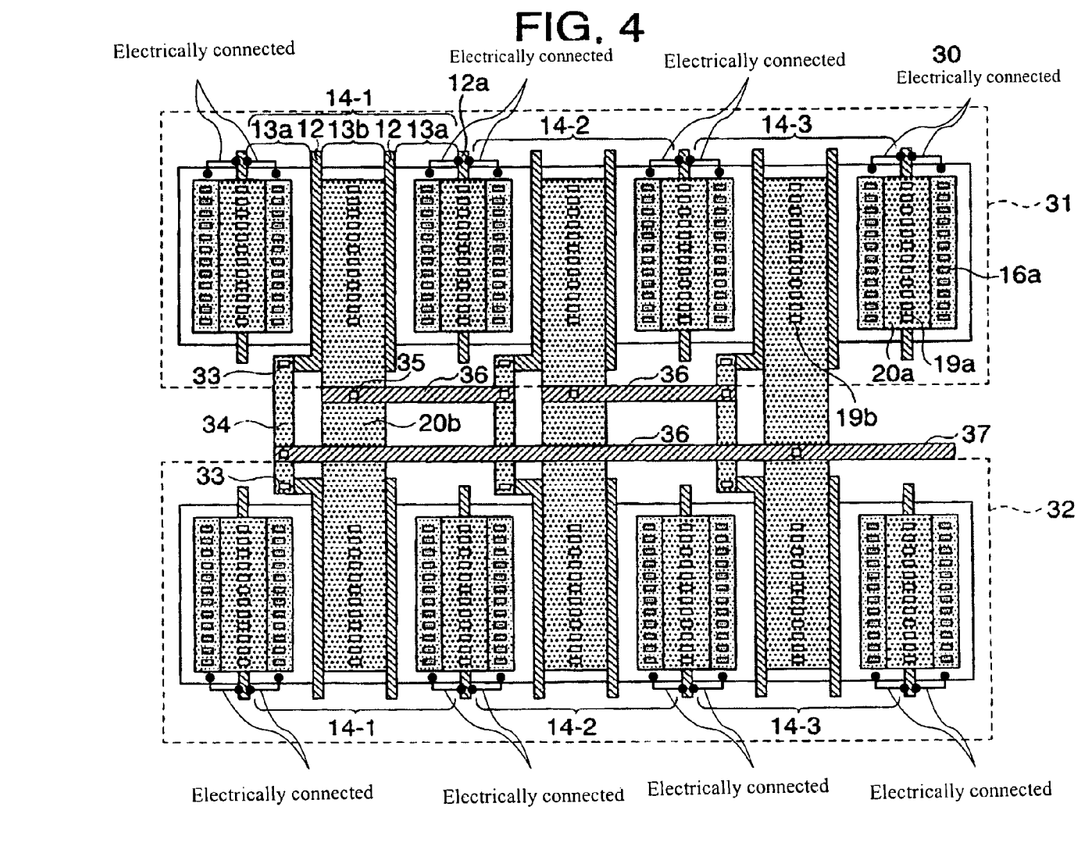
FIG. 4 is a top plan view of a semiconductor device according to a second embodiment of the present invention.

FIG. 4 is a top plan view of a semiconductor device according to a second embodiment of the present invention. The semiconductor device, generally designated by numeral 30, includes therein a ring oscillator such as shown in FIG. 8, which includes a PMOS section 31 configured as by the portion of the semiconductor device 10 shown in FIG. 1 and an NMOS section 32 including nMOS transistors 14-1, 14-2, and 14-3 and configured as NMOS transistors. The PMOS section 31 and NMOS section 32 are arranged in parallel to each other in the lengthwise direction, with the pMOS transistors 14-1 to 14-3 of PMOS section 31 and the respective nMOS transistors 14-1 to 14-3 of NMOS section 32 opposing each other.

The second-layer drain line 20b of the PMOS section 31 extends toward the NMOS section 32 to be connected to the second-layer drain line 20b of the NMOS section 32. Pairs of gate electrodes 12 formed in the pMOS transistors 14-1 to 14-3 of the PMOS section 31 are connected to the counterparts of the NMOS section 32 through a contact 33 and a third-layer interconnect 34. Further, each pair of gate electrodes 12 is connected together via the third-layer interconnect 34, contacts 35, and a fourth-layer interconnect 36, to the second-layer drain line 20b of the precedent stage. The fourth-layer interconnect 36 which connects together the second-layer drain line 20b of the transistor 14-3 and the third-layer interconnect 34 of the transistor 14-1 is connected to an external output line 37 which extends from the fourth-layer interconnect 36.

In the NMOS section 32, the L-value of the gate electrodes including the normal gate electrodes 12 and dummy gate electrodes 12a are designed at 0.17 µm, and the intervals between adjacent two of the gate electrodes 12 and 12a are designed at 0.63 µm. The aspect ratio is about 3.7 in this configuration.

Each pair of transistors disposed in the pMOS section 31 and the nMOS section 32 of the semiconductor device 30 and opposing each other correspond to an inverter among the inverters 61-1 to 61-3 shown in FIG. 8. The third-layer interconnect 34 corresponds to the input terminal 62 shown in FIG. 8. The contacts 35 and fourth-layer interconnect 36 correspond to the interconnect 63 shown in FIG. 8. The external output line 37 corresponds to the output line 64 shown in FIG. 8.

The semiconductor device of the second embodiment and a conventional semiconductor device were manufactured as an example and a comparative example, respectively. The conventional semiconductor device includes the ring oscillator shown in FIG. 8, which includes a PMOS section configured by the portion of the semiconductor device 70 shown in FIG. 9 and an NMOS section including the nMOS transistors which replace the transistors 14-1, 14-2, and 14-3 shown in FIG. 9.

Figure 5:
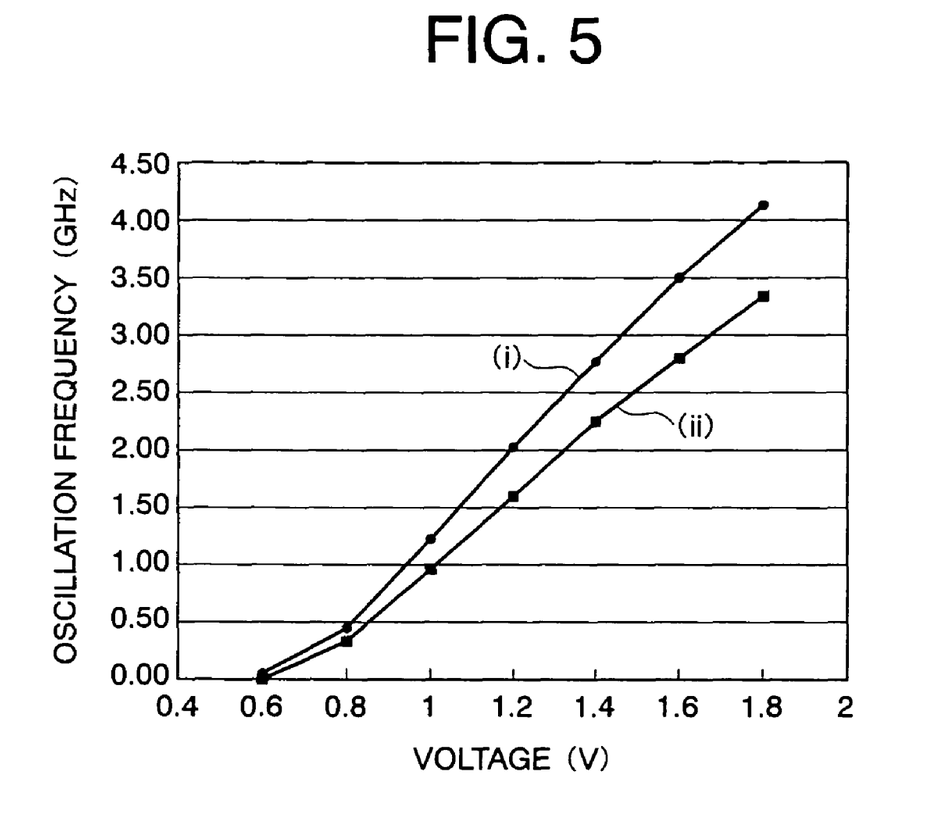
FIG. 5 is a graph showing a relationship between the operating frequency and voltage in semiconductor devices manufactured as an example and as a comparative example.

An experiment was conducted to investigate the relationship between the oscillation frequency and the applied voltage for the semiconductor devices of the example and comparative example. FIG. 5 shows the results of the experiment. In FIG. 5, the graph (i) shows the result obtained in the semiconductor device of the example, and the graph (ii) shows the results obtained in the semiconductor device of the comparative example. As will be understood from FIG. 5, the operating frequency of 1.6 GHz can be obtained with a voltage of 1.199 V in the semiconductor device of the comparative example; whereas, in the semiconductor device of the example, the same operating frequency can be obtained with a voltage of 1.099 V, which is lower than the applied voltage of the semiconductor device of the comparative example.

Figure 6:
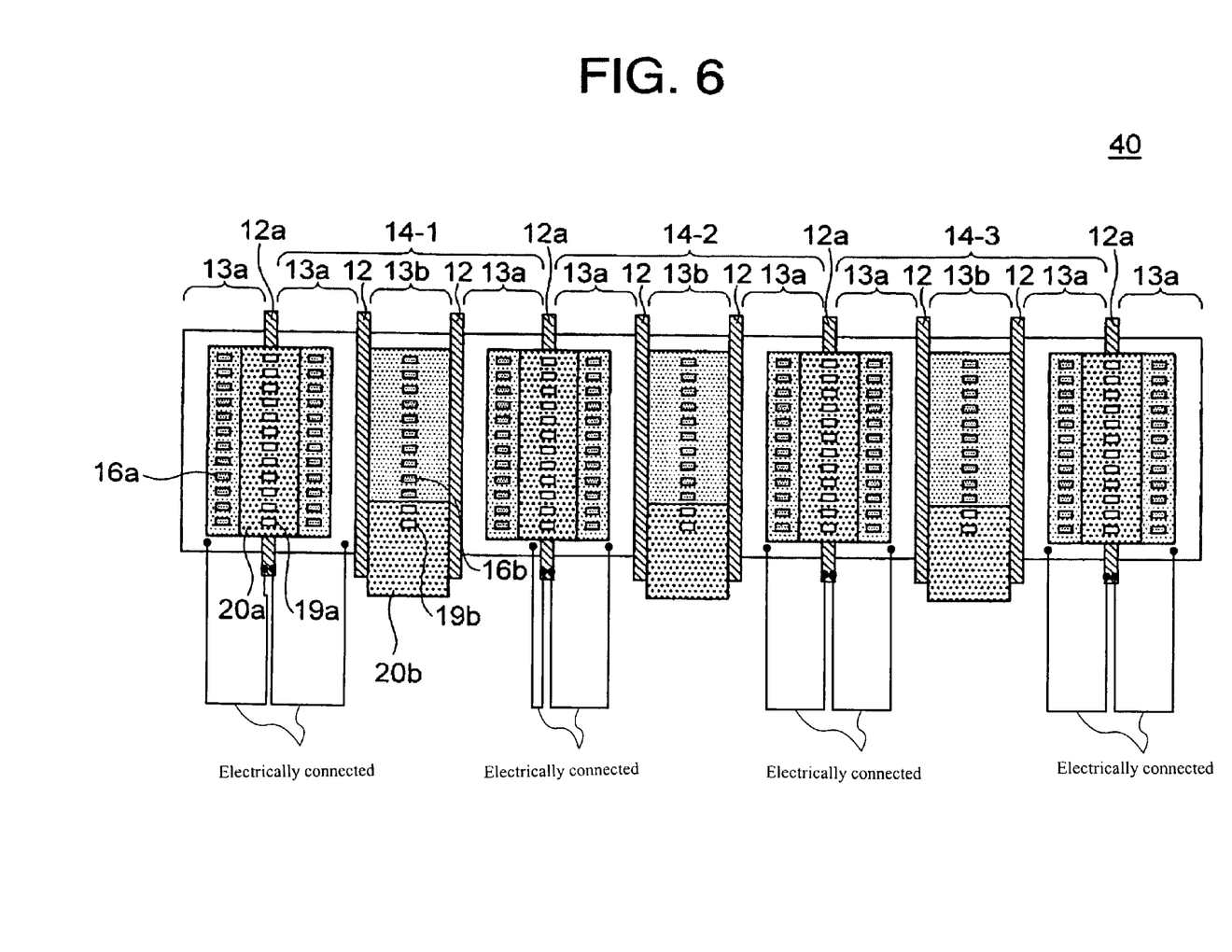
FIG. 6 is a top plan view showing a semiconductor device according to a third embodiment of the present invention.

FIG. 6 is a top plan view of a semiconductor device according to a third embodiment of the present invention. The semiconductor device, generally designated by numeral 40, is similar to the semiconductor device 10 of FIG. 1 except that the second-layer drain line 20b is formed only in the portion in the vicinity of the nMOS section. In the semiconductor device 40 of the present embodiment, the length of the portion in which the second-layer drain line 20b and the second-layer source line 20a extend parallel to each other or the length of the overlapping portion between the second-layer drain line 20b and the first-layer drain line 17b disposed below the second-layer drain line 20b or the underlying drain region 13b is reduced, thereby reducing the parasitic capacitance between them.

Figure 7:
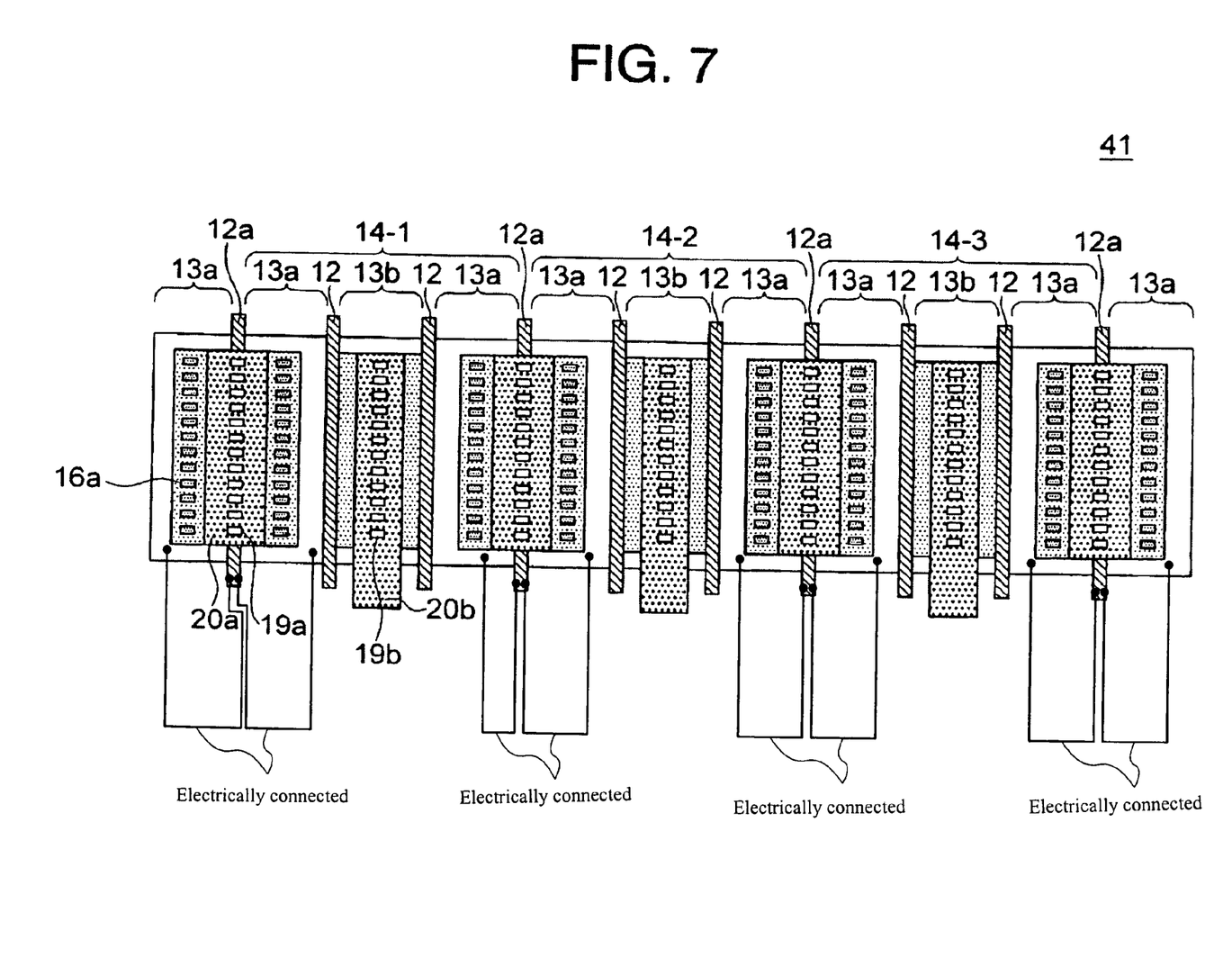
FIG. 7 is a top plan view showing a semiconductor device according to a fourth embodiment of the present invention.

FIG. 7 is a top plan view of a semiconductor device according to a fourth embodiment of the present invention. The semiconductor device, generally designated by numeral 41, is similar to the semiconductor device 10 of FIG. 1 except that the width of the second-layer drain line 20b is designed at 0.15 µm, which is the minimum value in the design rule of the semiconductor device. In the semiconductor device 41 of the present embodiment, the interval between the second-layer drain line 20b and the second-layer source line 20a is increased to thereby reduce the parasitic capacitance therebetween. Further, the length of the overlapping portion between the second-layer drain line 20b and the first-layer drain line 17b disposed below the second-layer drain line 20b and between the second-layer drain line 20b and the drain region 13b disposed below the second-layer drain line 20b is reduced, thereby reducing the parasitic capacitance between them.

Although the present invention has been described with reference to the preferred embodiments, the semiconductor device according to the present invention is not limited to the configuration shown in the above embodiments and various changes, modifications, or alternations to the embodiments as described herein may be made, none of which depart from the spirit of the present invention. All such changes, modifications, and alternations should therefore be regarded to fall within the scope of the present invention.

What is claimed is:

1. A semiconductor device comprising:
   a semiconductor substrate;
   a plurality of MOS transistors arranged on the semiconductor substrate in a row and each including a drain region, a pair of source regions, and a pair of normal gate electrodes, which are arranged in a direction of the row, the pair of source regions sandwiching therebetween the drain region, each of the normal gate electrodes overlying a space between the drain region and a corresponding one of the source regions;
   a plurality of dummy gate electrodes each overlying a space between one of the source regions of one of the MOS transistors and one of the source regions of an adjacent one of the MOS transistors, each of the dummy gate electrodes being maintained at an equi-potential with the one of the source regions of the one or the adjacent one of the MOS transistors by electrically connecting the each of dummy gate electrodes with the one of the source regions of the one or the adjacent one of the MOS transistors; and
   a plurality of source-side interconnects, each of the source-side interconnects being connected to adjacent two of the source regions sandwiching therebetween one of the dummy gate electrodes, the each of the source-side interconnects overlies one of the dummy gate electrodes, the each one of the source-side interconnects is disposed between each of two adjacent transistors, the each one of the source-side interconnects has a width smaller than a total width of the adjacent two of the source regions,
   wherein the normal gate electrodes and the dummy gate electrodes of all of the transistors have the same gate width.

2. A semiconductor device, comprising:
   a first transistor including a first source region, a second source region, a first drain region, a first gate electrode sandwiched between the first source region and the first drain region, and a second gate electrode between the second source region and the first drain region;

a second transistor including a third source region, a fourth source region, a second drain region, a third gate electrode sandwiched between the third source region and the second drain region, and a fourth gate electrode sandwiched between the fourth source region and the second drain region;

a third transistor including a fifth source region, a sixth source region, a third drain region, a fifth gate electrode sandwiched between the fifth source region and the third drain region, and a sixth gate electrode sandwiched between the sixth source region and the third drain region;

a first dummy gate electrode provided between the second source region of the first transistor and the third source region of the second transistor and electrically connected to at least one of the second source region of the first transistor and the third source region of the second transistor; and a second dummy gate electrode provided between the fourth source region of the second transistor and the fifth source region of the third transistor and electrically connected to at least one of the fourth source region of the second transistor and the fifth source region of the third transistor, wherein the first dummy gate electrode is electrically connected to both of the second source region of the first transistor and third source region of the second transistor, the second dummy gate electrode being electrically connected to both of the fourth source region of the second transistor and the fifth source region of the third transistor.

3. The semiconductor device according to claim 2, wherein the first, second, third, fourth, fifth and sixth gate electrodes have substantially the same lengths as each other.

4. The semiconductor device according to claim 3, wherein each of the first and second dummy gate electrodes has substantially the same length as a length of each of the first, second, third, fourth, fifth and sixth gate electrodes.

5. The semiconductor device according to claim 3, wherein the first, second, third, fourth, fifth, and sixth gate electrodes have substantially the same widths as each other.

6. The semiconductor device according to claim 5, wherein each of the first and second dummy gate electrodes has substantially the same width as a width of each of the first, second, third, fourth, fifth, and sixth gate electrodes.

7. The semiconductor device according to claim 2, wherein the first, second and third transistors are the same in conductive type as each other.

8. The semiconductor device according to claim 2, wherein the first and second gate electrodes of the first transistor are electrically connected to each other, the third and fourth gate electrodes of the second transistor being electrically connected to each other, and the fifth and sixth gate electrodes of the third transistor being electrically, connected to each other.

9. A semiconductor device, comprising:
a first diffusion region;
a second diffusion region;
a first gate electrode sandwiched between the first and second diffusion regions;
a third diffusion region;
a first dummy gate electrode sandwiched between the second and third diffusion regions, and electrically connected to at least one of the second and third diffusion regions;
a fourth diffusion region;
a second gate electrode sandwiched between the third and fourth diffusion regions;
a fifth diffusion region;
a third gate electrode sandwiched between the fourth and fifth diffusion regions;
a sixth diffusion region;
a second dummy gate electrode sandwiched between the fifth and sixth diffusion regions, electrically connected to at least one of the fifth and sixth diffusion regions
a seventh diffusion region; and
a fourth gate electrode sandwiched between the sixth and seventh diffusion regions,
wherein the first dummy gate electrode is electrically connected to both of the second and third diffusion regions and the second dummy gate electrode is electrically connected to both of the fifth and sixth diffusion regions.

10. The semiconductor device according to claim 9, wherein each of the first, and second diffusion regions and the first gate electrode is defined as an associated one of parts included in a first transistor, each of the third, fourth, and fifth diffusion regions and the second and third gate electrodes being defined as an associated one of parts included in a second transistor, and each of the sixth and seventh diffusion regions and the fourth gate electrode being defined as an associated one of parts included in a third transistor.

11. The semiconductor device according to claim 9, wherein the first, second, third, and fourth gate electrodes have substantially the same lengths as each other.

12. The semiconductor device according to claim 11, wherein each of the first and second dummy gate electrodes has substantially the same length as a length of each of the first, second, third, and fourth gate electrodes.

13. The semiconductor device according to claim 11, wherein the first second, third, and fourth gate electrodes have substantially the same widths as each other.

14. The semiconductor device according to claim 13, wherein each of the first and second dummy gate electrodes has substantially the same width as a width of each of the first, second third, and fourth gate electrodes.

15. The semiconductor device according to claim 10, wherein the first, second and third transistors are the same in conductive type as each other.

* * * * *